(12) United States Patent
Lazarescu

(10) Patent No.: US 6,593,819 B2
(45) Date of Patent: Jul. 15, 2003

(54) LOW PHASE NOISE DUAL BAND VOLTAGE CONTROLLED OSCILLATOR

(75) Inventor: Raducu Lazarescu, Carol Stream, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/845,019

(22) Filed: Apr. 28, 2001

(65) Prior Publication Data

US 2002/0158695 A1 Oct. 31, 2002

(51) Int. Cl.⁷ .................................................. H03L 7/00
(52) U.S. Cl. .......................................... 331/49; 331/18
(58) Field of Search ................................ 331/49.48, 18, 331/117 R

(56) References Cited

U.S. PATENT DOCUMENTS 5,418,497 A * 5/1995 Martin ................... 331/117 R

* cited by examiner

*Primary Examiner*—Robert Pascal
*Assistant Examiner*—Joseph Chang
(74) *Attorney, Agent, or Firm*—Mark Bourgeois; Breffni X. Baggot

(57) ABSTRACT

A dual band voltage controlled oscillator that has low phase noise. The oscillator includes two voltage controlled oscillators that are each coupled to a tank circuit for adjusting the output frequency. One voltage controlled oscillator operates at a low frequency and one operates at a high frequency. Both voltage controlled oscillators are coupled to a combiner circuit that provides the oscillator output signal. A low frequency bandstop filter is coupled to the output of the second voltage controlled oscillator. The low frequency bandstop filter operates so as to reject the low frequency.

23 Claims, 4 Drawing Sheets

1 IN. (.005 TO .030)
FREQUENCY (2,000 GHZ TO 2.500 GHZ

LOW PHASE NOISE DUAL BAND VOLTAGE CONTROLLED OSCILLATOR

TECHNICAL FIELD

The present invention relates generally to voltage controlled oscillators used in frequency synthesizers in communication devices and, in particular, to a dual band voltage controlled oscillator with low phase noise.

BACKGROUND OF THE INVENTION

Analog and digital devices for personal communications such as in portable telephones operate in more than one frequency band. The frequency bands around 1.0 GHz and 2.0 GHz are now used in the majority of portable phones. Local oscillators for these dual band portable telephones are required to operate in two widely separated frequency ranges. Stringent requirements are placed on these oscillators in terms of their operating performance parameters. The oscillator characteristics such as phase noise, load pull, power supply pushing and output power must meet the specified requirements. At the same time, the oscillator must be cost effective and readily manufacturable. Prior art dual band devices have included: completely separate local oscillators with combiner networks, local oscillators with doublers or triplers to multiply frequency, PIN diodes or other similar RF switching devices, and extremely wide band oscillators having an operable frequency range that overlaps the two bands of interest.

The use of signal frequency doublers or triplers in oscillators to multiply the frequency has disadvantages in that spurious signals are always present in the output. These spurious signals must be filtered out to avoid degrading receiver performance or interference with other radio services. In addition, the parts count increases greatly with doublers and triplers and the desired output frequencies must exactly match those multiples. Phase noise increases with frequency doubling or tripling.

Some oscillators use PIN diodes. The disadvantage of PIN diodes in oscillators is that PIN diodes require significant DC current to obtain a low "on" impedance, and when the PIN diodes are "off" they can create high levels of harmonically related spurious signals, losses and distortions. Tank circuits associated with the PIN diodes reduce circuit Q, which reduces efficiency, and causes higher phase noise in the output circuit.

The field of oscillators includes wide band oscillators and dual band voltage controlled oscillators (VCO). The disadvantage of using extremely wide band oscillators is that wideband oscillators are necessarily very sensitive to tuning control. This sensitivity makes the oscillator more susceptible to noise on the tuning control line. Correspondingly, more sensitive tuning requires tighter coupling to the tuning element (varactor) of the oscillator which causes higher losses in the associated tank circuit.

One example of a dual band voltage controlled oscillator (VCO) is shown in U.S. Pat. No. 5,821,820 to Snider. This dual band VCO uses separate oscillators for each frequency band with a combiner circuit, however, only one varactor is required. One problem with this type of oscillator is related to the DC switching of the two transistors. In order to switch the bands, the VCO uses two ENABLE lines. This adds cost and complexity to the circuit design.

Another problem with the teaching of Snider resides in the common use of the same tank circuitry in generating both of two widely separated frequency bands (900 MHz and 1.8 GHz). It is not possible to design the tank in such a way that the conditions for minimum phase noise are met simultaneously in both bands.

Snider draws those two frequency bands from the collectors of each of two bi-polar junction transistors, one frequency band from each collector. It is noted that extracting the output signals from the collector of the two transistors is not a good choice when harmonics content is an issue. Even though the loaded Q of the tank circuit is relatively high, the current through the active element of an oscillator is distorted in order to sustain the limiting process. Because the collector voltage is proportional to the collector current it is expected that the harmonics content will be high.

There is a present unmet need for a dual band voltage controlled oscillator with low phase noise that overcomes the limitations of the prior art and is readily manufacturable at a low cost.

SUMMARY

It is a feature of the invention to provide a dual band voltage controlled oscillator with low phase noise.

A further feature of the invention is to provide a multi-band oscillator that includes a high and low tank circuit that is responsive to a tuning voltage, each tank circuit having an output. A high voltage controlled oscillator is operated at a high frequency and has an input and an output. The output of the high tank circuit is coupled to the input of the high voltage controlled oscillator. A low voltage controlled oscillator operates at a low frequency and has an input and an output. The output of the low tank circuit is coupled to the input of the low voltage controlled oscillator. A combiner circuit has a high and low input and an output. The high and low inputs of the combiner circuit are coupled to the respective outputs of the high and low voltage controlled oscillators. A low frequency bandstop filter is coupled to the output of the high frequency voltage controlled oscillator. The low frequency bandstop filter operates so as to prevent the low frequency signal from being diverted to ground rather than produced as an output from the combiner.

Those skilled in the art will appreciate that the conception, upon which this disclosure is based, may readily be utilized as a basis for the design of other structures, methods and systems for carrying out the several purposes of the present invention.

BRIEF DESCRIPTION OF THE DRAWINGS

In the accompanying drawings that form part of the specification, and in which like numerals are employed to designate like parts throughout the same.

DETAILED DESCRIPTION OF PREFERRED EMBODIMENTS

Figure 1:
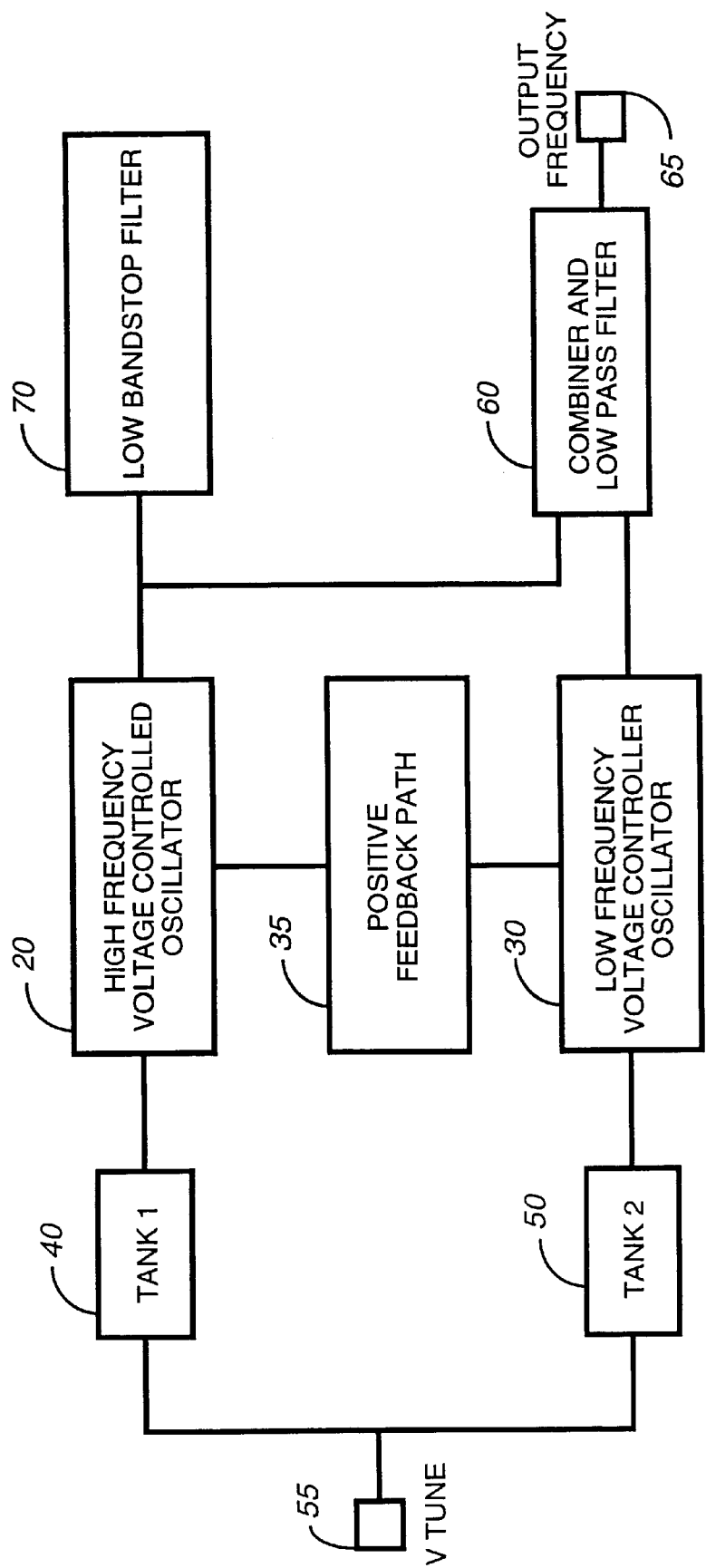
FIG. 1 is a block diagram of a dual band voltage controlled oscillator, in accordance with the present invention.

Referring to FIG. 1, a block diagram of a dual band voltage controlled oscillator with low phase noise 10 is shown. Dual band oscillator 10 includes a high frequency voltage controlled oscillator (VCO) 20 and a low frequency voltage controlled oscillator (VCO) 30. A first high frequency tank circuit 40 and second low frequency tank circuit 50 have inputs that are connected to a tuning voltage terminal Vtune 55. The first and second tank circuits 40 and 50 each have outputs that are coupled to inputs of the voltage controlled oscillators 20 and 30, respectively. The tank circuits are responsive to the tuning voltage Vtune in order to adjust their resonant frequencies. The high frequency voltage controlled oscillator 20 operates at a high frequency such as 2 GHz and the low frequency voltage controlled oscillator 30 operates at a (second or) low frequency such as 1 GHz.

The outputs of the voltage controlled oscillators 20 and 30 are fed into a combiner circuit and low pass filter 60. An output frequency terminal 65 is connected to the output of the combiner circuit 60. The low pass filter type combiner has a triple role:

it attenuates the harmonics of one of the VCO's RE output signals at terminal 65 isolates the outputs of the two oscillators from each other and from the load provides the DC paths for the emitter biasing currents A low bandstop filter 70 is connected at the output of the voltage controlled oscillator 20 to prevent the low or 1 GHz frequency of VCO 30 from reaching ground through the low output impedance of oscillator 20 when voltage controlled oscillator 30 is operating.

A positive feedback path 35 is connected between voltage controlled oscillators 20 and 30 to improve switching of the voltage controlled oscillators 20 and 30.

Figure 2:
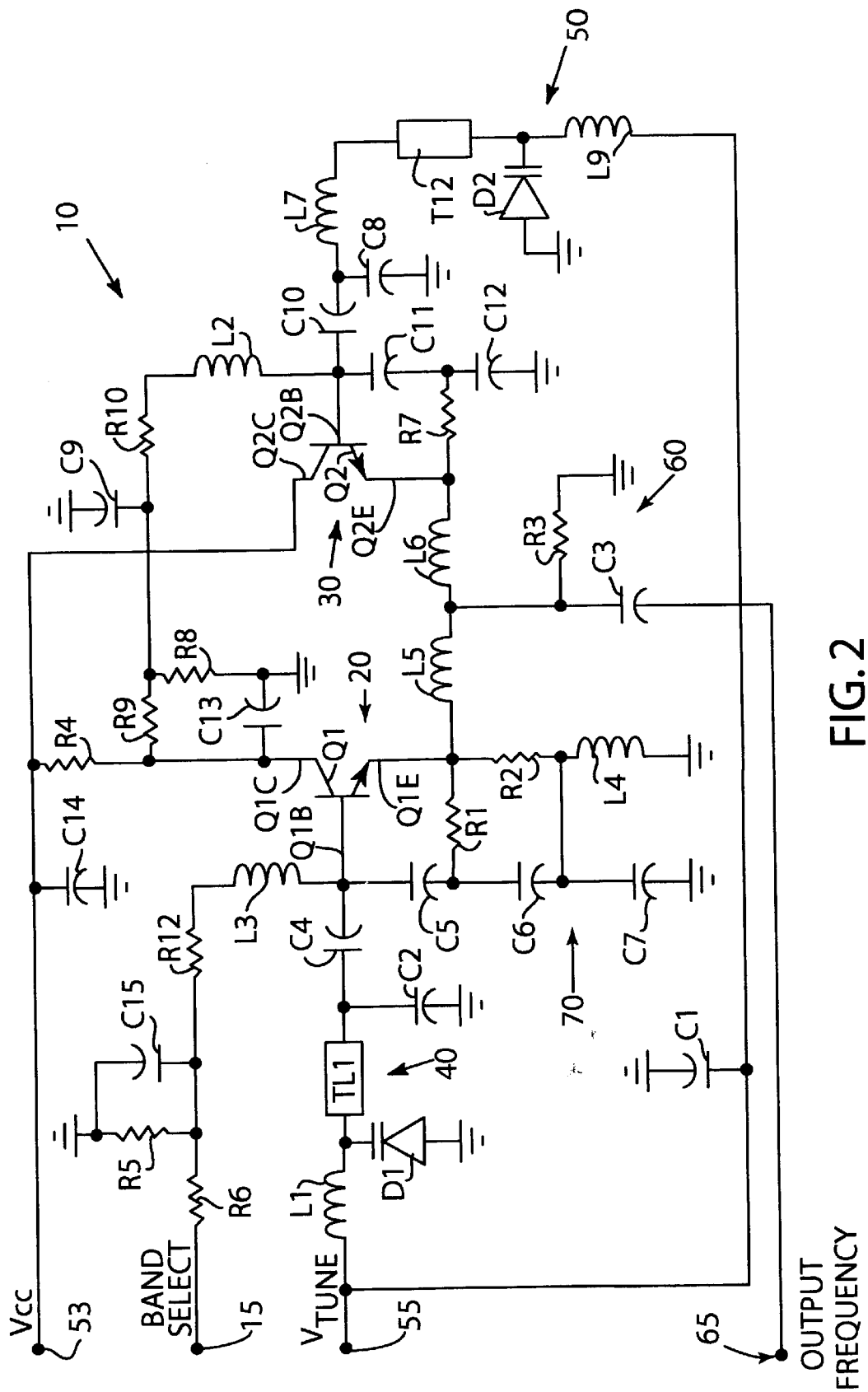
FIG. 2 is a simplified circuit diagram of the dual band voltage controlled oscillator of FIG. 1.

FIG. 2 is a simplified circuit diagram of the dual band voltage controlled oscillator 10 of the present invention. Voltage controlled oscillator 20 includes a transistor Q1 and a transistor biasing network that includes the voltage divider resistors R5, R6 and R12. Transistor Q1 has a base Q1B, an emitter Q1E and a collector Q1C. The base Q1B is capacitively coupled by capacitor C4 to resonant tank circuit 40. A positive feedback loop between emitter Q1E and base Q1B is formed by capacitors C5 and C7. Tank circuit 40 includes a varactor D1, a transmission line TL1 and a capacitor C2. A capacitor C2 is connected with the varactor D1 to provide a desired tuning sensitivity. The varactor D1 is adjusted by a tuning signal Vtune at terminal 55, connected through an isolation inductor L1.

Similarly, low frequency voltage controlled oscillator 30 includes a transistor Q2 and a transistor biasing network that includes resistors R4, R8, R9 and R10. Transistor Q2 has a base Q2B, an emitter Q2E and a collector Q2C. The base Q2B is capacitively coupled by capacitor C10 to resonant tank circuit 50. Capacitors C11 and C12 form a positive feedback loop between emitter Q2E and base Q2B. Tank circuit 50 includes a varactor D2, a transmission line TL2, inductor L7, and capacitor C8. Capacitor C8 is connected in series with the varactor D2 to provide a desired tuning sensitivity. The varactor D2 is adjusted by tuning signal Vtune connected through isolation inductor L9.

Tuning voltage Vtune changes the resonant tank circuits within the operable frequency band of each oscillator. This is useful in radio communication devices using frequency synthesizers that change channels within a frequency band during operation. The actual values of the circuit components are selected to accommodate a desired frequency band.

The transistors Q1 and Q2 have their collectors connected to ground through capacitors C13 and C14. Voltage Vcc at terminal 53 is connected to collectors Q1C and Q2C. C13 and C14 are selected to have their series parasitic resonant frequency in the middle of the first or high frequency band (2 GHz) and second or low frequency band (1 GHz) respectively.

The emitters of transistors Q1 and Q2 are connected together through inductors L5 and L6 to form a Schmitt trigger. The input voltage of this trigger is the "Band Select" line at terminal 54.

When the band select line is connected to the Vcc potential, Q1 is in it's ON state. Suppose R5 and R6 are calculated to provide for 1.6V DC bias of Q1 base and R2 is selected for 12 mA through this transistor. There will be a 0.85V drop on Q1's base-emitter junction so that the emitter will be 0.75V relative to ground. In order to keep Q2 OFF even at its negative emitter peaks of the RF signal, the Q2's base should be biased at 1.2V or less. Another reason for this less than 1.6V is that with no current flowing through Q2, its base-emitter junction voltage drop is less than 0.85V (estimated at about 0.55V for low residual collector currents).

Now, when the "Band Select" 54 is connected to ground in order to switch Q1 OFF, if the base of Q2 remained at 1.2V and there is a 0.85V base-emitter drop, then the new emitter voltage is only 0.35V. The bias current when Q2 is conducting is less than about 50% of the current when Q1 is ON.

In order to keep the DC currents equal through Q1 and Q2, each time they are in their ON state, the base potential should stay at about the same level (e.g. 1.6V). This is implemented using the Schmitt trigger configuration mentioned above. Positive feedback path 35 (FIG. 1) is between high and low voltage controlled oscillators 20 and 30. The positive feedback loop comprises resistors R4, R9, R8, transistors Q1, Q2 and inductors L5 and L6.

When Q1 is ON the voltage drop on R4 is divided down to the base of Q2 to keep it biased OFF, deep enough to avoid interference with Q1 (for low phase noise and current consumption). When Q1 is switched OFF, the voltage drop on R4 due to the fact that its collector current is removed and this positive step is applied through R9 and R8 to the base of Q2 which is brought up to about the same 1.6V level at which Q1 was when conducting. In this way Q1 and Q2 will oscillate with the same DC current, for good output power and phase noise in both bands. In other words, when Q1 is switched ON, the voltage drop on its collector resistor R4 pulls down the base potential of Q2, counteracting the base-emitter voltage drop of Q2, such that the DC current through Q1 when it is in its ON state has the same magnitude as Q2 has when it is in its ON state. base of Q2 to keep it biased OFF, low enough to avoid interference with Because the band stop circuit resonates in a lower frequency band, at higher frequencies it behaves capacitively. This capacitance together with capacitor C5 makes the positive feedback divider of the high frequency band VCO 20.

The voltage divider R5 and R6 is a source of thermal noise for the high frequency VCO 20. This noise is translated as a $1/f^2$ noise around the oscillating frequency. In order to filter out this component of phase noise, capacitor C15 is inserted across this divider. Inductor L3 is necessary to isolate the base of Q1 from this low impedance to ground through capacitor C15. In order to avoid parasitic oscillations due to inductor L3, resistor R12 lowers the Q of this circuit. For the same reasons, components L2, R10 and 09 are used in the low frequency VCO 30.

Resistor R3 has a triple role. Resistor R3 forms together with L5 or L6 a low pass filter to lower the output harmonics content. Also, R3 is in parallel with the output load to keep the load pulling low. Finally, resistor R3 closes the DC bias path to ground for the emitter currents of either Q1 or Q2.

Since inductor L4 in the band stop circuit is a DC short to ground, resistor R2 is connected in series. The value of R2 is selected such that in parallel with R3 it determines the required DC emitter currents. At high band frequencies of the VCO 20, this R3 resistor is decoupled by C6, which is series resonating together with its parasitic inductance. In this way, for the high frequencies involved, R2 is in parallel with a negative feedback resistor R1. Capacitors C5 and C7 are connected in series.

Capacitor C1 is connected between Vtune terminal 55 and ground. Capacitor C1 and inductor L1 form a filter to reject noise from the high band of Vtune. Capacitor C1 and inductor L9 filter out noise from the low band.

Resistor R7 is connected between emitter Q2E and the junction capacitors C11 and C12. Resistor R7 is a negative feedback element linearizing the gain of the transistor Q2 to lower the phase noise of the low band VCO.

The circuit of FIG. 2 was simulated using a commercial microwave harmonic balance circuit simulator; for example. The low frequency band was selected between 1040–1090 MHz and the second frequency band was selected between 2080–2200 MHz. A phase noise of –123 dBc/Hz at 60 kilohertz away from the carrier in the 1 GHz band and –141 dBc/Hz at 1.25 MHz away form the carrier in the 2 GHz band were obtained. Load pulling of +/–1 MHz for a Voltage Standing Wave Ratio (VSWR) of 2:1 and power supply pushing of 0.3 MHz/volt and 1 MHz/volt, respectively, were obtained with the circuit of FIG. 2.

Figure 3:
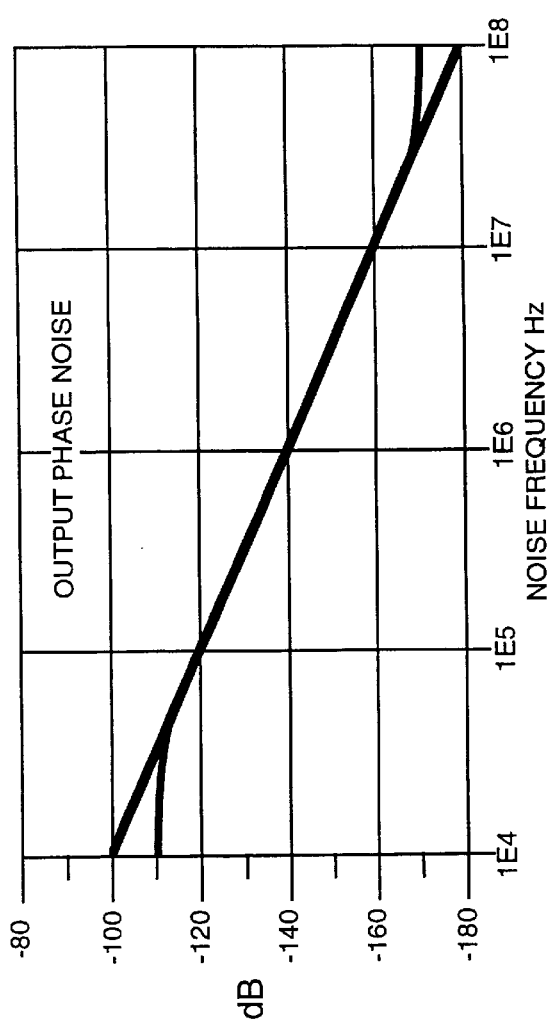
FIG. 3 is a phase noise plot for a voltage controlled oscillator according to FIG. 1.
Figure 4:
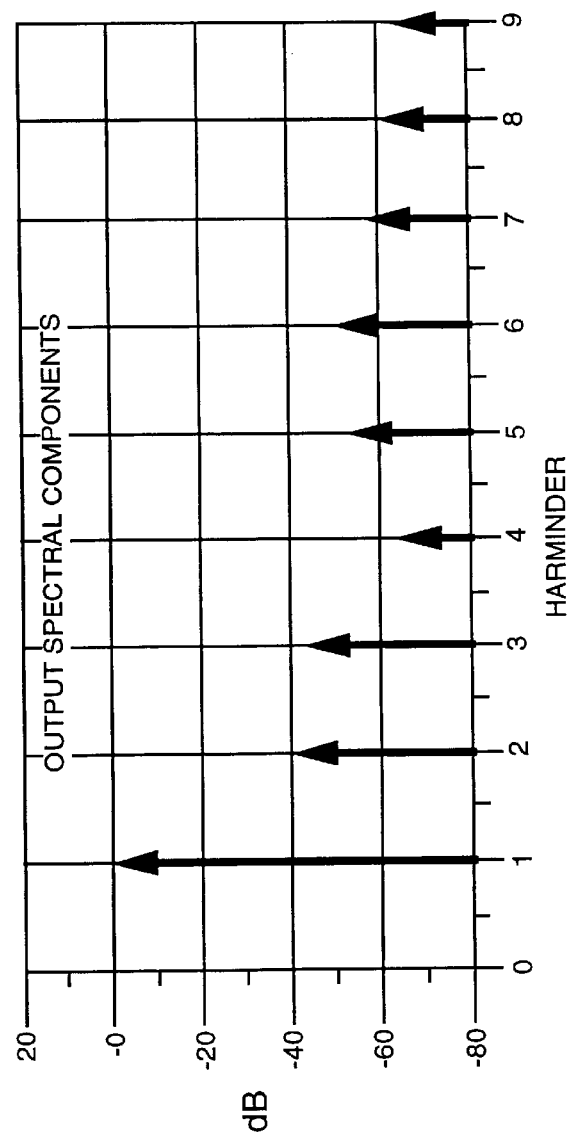
FIG. 4 is a chart showing the harmonic content in the output signal of a voltage controlled oscillator according to FIG. 1.

FIG. 3 shows a plot of the simulated phase noise of the dual band voltage controlled oscillator 10. FIG. 4 shows a graph of the harmonic content of the output signal of the voltage-controlled oscillator 10.

Figure 5:
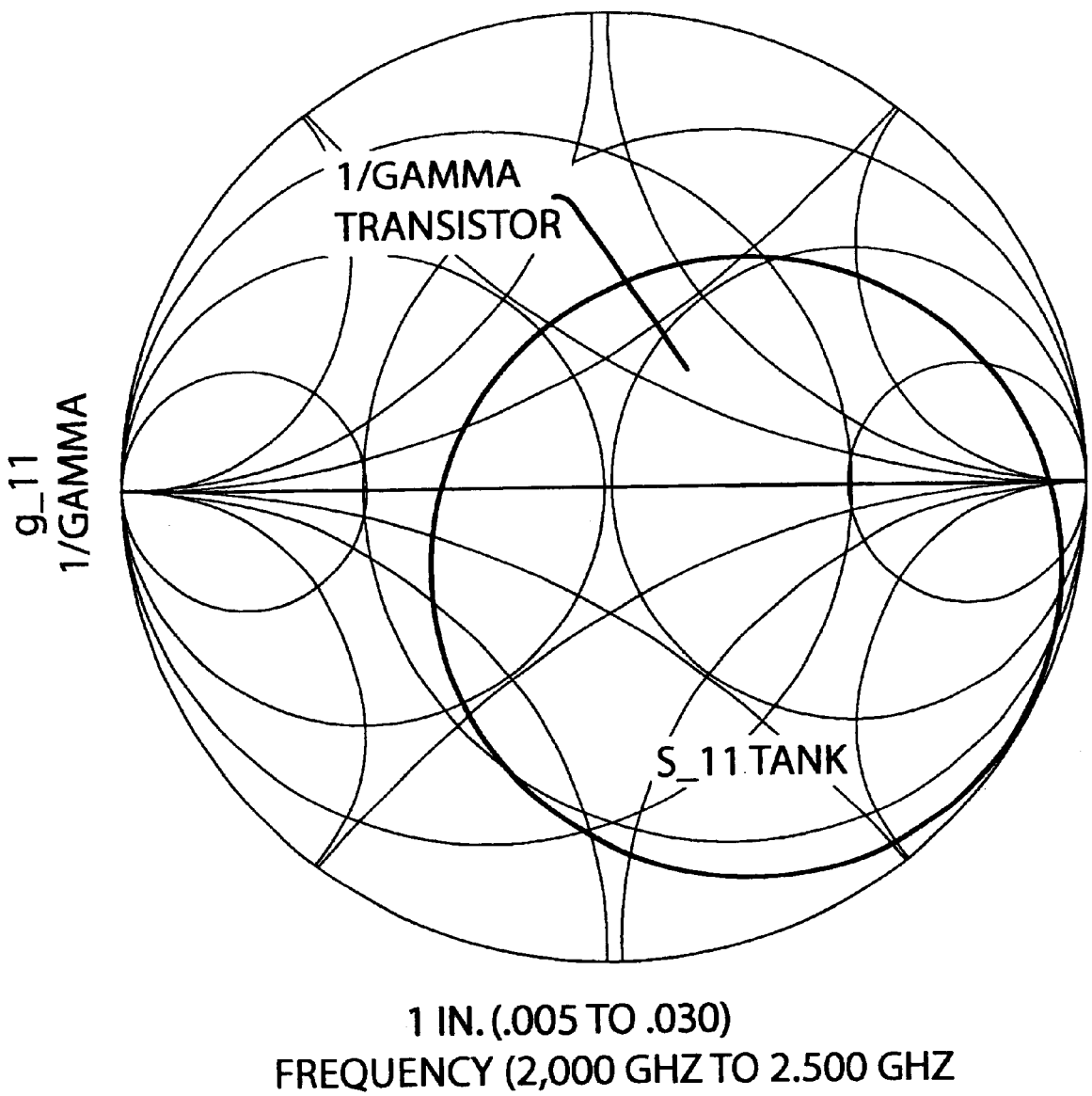
FIG. 5 is a Smith chart of S11 versus frequency for the circuit of FIG. 1.

FIG. 5 shows a Smith chart plot of input reflection coefficient S11 of the tank circuit 40 combined with C4 between 2.0 and 2.5 GHz. The circle of reflection coefficient S11 is intersected by the inverse of the transistor Q1 input reflection coefficient at a point determining the frequency of oscillation and the amplitude. These two curves need to intersect at 90 degrees in order for the generated phase noise to be at a minimum. This is accomplished by the selection of the feedback capacitors C5 and C7 and the inductor L4.

The oscillator may be of other oscillator configurations including, but not limited to, Colpitts, Driscoll, Butler, Pierce, and Hartley. The novel configuration of the dual band voltage controlled oscillator advantageously generates widely separated frequencies with very low phase noise and using only one line to switch the bands.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A multi-band oscillator, comprising:
   a first and second tank circuit responsive to a tuning voltage, each tank circuit having an output;
   a first voltage controlled oscillator operable at a first frequency and having an input and an output, the output of the first tank circuit coupled to the input of the first voltage controlled oscillator;
   a second voltage controlled oscillator operable at a second frequency and having an input and an output, the output of the second tank circuit coupled to the input of the second voltage controlled oscillator;
   a combiner circuit having a first and second input and an output, the first and second inputs of the combiner circuit coupled to the respective outputs of the first and second voltage controlled oscillators; and
   a frequency bandstop filter coupled to the output of the first voltage controlled oscillator, the frequency bandstop filter operable to reject the second frequency.

2. The multi-band oscillator according to claim 1 wherein a positive feedback path is coupled from the first to the second voltage controlled oscillator.

3. The multi-band oscillator according to claim 1 wherein a low pass filter is coupled as a combiner for rejecting harmonics of the first and second frequencies.

4. The multi-band oscillator according to claim 1, wherein each voltage controlled oscillator further comprises:
   an emitter coupled Schmitt trigger transistor; and
   a transistor biasing network coupled to the transistor, the transistor operable to be switched on and off via a control signal applied to the biasing network.

5. The multi-band oscillator according to claim 4 wherein the first and second tank circuits each further comprises:
   a transmission line coupled to the varactor;
   a first capacitor series-coupled to the transmission line; and
   a second capacitor capacitively coupling the tank circuit to the input of the voltage controlled oscillators, the varactor providing a varying capacitance responsive to the tuning voltage such that the operating frequencies of the voltage controlled oscillators are adjustable.

6. The multi-band oscillator according to claim 1 wherein the first and second tank circuits each includes a varactor for tuning the first and second frequencies.

7. The multi-band oscillator according to claim 6, wherein each of the transistors has an AC grounded collector grounded a series resonant decoupling capacitor.

8. The multi-band oscillator according to claim 7, wherein a series resonant circuit is coupled to an emitter of the transistor for bypassing a DC biasing resistor coupled to the emitter.

9. The multi-band oscillator according to claim 6, wherein an input of each of the voltage controlled oscillators has a series RLC circuit connected to ground to minimize phase noise due to thermal noise of the biasing network.

10. The oscillator of claim 1, wherein the first frequency is a high frequency, having a higher magnitude than the second frequency, and wherein the second frequency is, accordingly, a low frequency.

11. The oscillator of claim 1 wherein the first frequency is approximately 2 gigahertz, and wherein the first frequency is higher in magnitude relative to the second frequency.

12. The oscillator of claim 1 wherein the second frequency is approximately 1 gigahertz and is a low frequency, having a lower magnitude than the first frequency.

13. A multi-band oscillator, comprising:
   a) first and second tank circuits, each responsive to a tuning voltage, each tank circuit having an output;
   b) first and second transistors, each having an emitter, said first and second transistors being connected to one another at said emitters, the first transistor operable at a first frequency and having an in put and an output, the output of the first tank circuit coupled to the input of the first transistor, the second transistor operable at a second frequency and having an input and an output, the output of the second tank circuit coupled to the input of the second transistor;

c) a combiner circuit having a first and second input and an output, the first and second inputs of the combiner circuit coupled to the respective outputs of the first and second transistors; and d) wherein a positive feedback path is coupled between the first and second transistors.

14. The multi-band oscillator according to claim 13 wherein a low frequency bandstop filter is coupled to the output of the first transistor, the low frequency bandstop filter operable to reject the second frequency.

15. The multi-band oscillator according to claim 14, wherein the first and second tank circuits each includes a varactor and each transistor has an AC grounded collector connected through a series resonant decoupling capacitor.

16. The multi-band oscillator according to claim 15 wherein the first and second tank circuits each further comprises:

a transmission line coupled to the varactor;

a first capacitor series coupled to the transmission line; and a second capacitor capacitively coupling the tank circuit to the input of the transistors, the varactor providing a varying capacitance responsive to the tuning voltage such that the operating frequencies of the transistors are adjustable.

17. The multi-band oscillator according to claim 15, wherein each transistor has an AC grounded collector connected through a series resonant decoupling capacitor.

18. The multi-band oscillator according to claim 17, wherein a series resonant circuit is coupled to the emitter of the transistor for bypassing a DC bias resistor coupled to the emitter.

19. The multi-band oscillator according to claim 13, wherein an inputs of each transistor has a series RLC circuit connected to ground to minimize phase noise due to thermal noise of the biasing network.

20. The multi-band oscillator according to claim 13 wherein a low pass filter is coupled as a combiner for rejecting harmonics of the first and second frequencies.

21. The multi-band oscillator according to claim 13 wherein each transistor is configured as a Schmitt trigger and has a biasing network coupled to the transistor, the transistors switched on and off via a control signal applied to the biasing network of one of the transistors.

22. A method of operating a multi-band oscillator, comprising:

providing a first and second tank circuit responsive to a tuning voltage;

generating a first and second tank signal by the tank circuits;

providing a first and second voltage controlled oscillator;

inputting the first and second tank signals to the first and second voltage controlled oscillators;

operating the first oscillator at a first frequency and the second oscillator at a second frequency in response to the first and second tank signals;

providing a combiner circuit coupled to outputs of the first and second voltage controlled oscillators and a low frequency bandstop filter coupled to the output of the first voltage controlled oscillator;

inputting the first and second frequencies to the combiner circuit; and rejecting the second frequency using the low frequency bandstop filter.

23. A multi-band oscillator, comprising:

a first and second voltage controlled oscillator operable to generate a first and second frequency;

a first and second tank circuit coupled to the first and second voltage controlled oscillators, respectively for adjusting the first and second frequency;

a combiner circuit coupled to the first and second voltage controlled oscillators; and a low frequency bandstop filter coupled to the first voltage controlled oscillator for rejecting the first frequency.

* * * * *